(12) United States Patent
Liu et al.

(10) Patent No.: US 6,989,712 B2
(45) Date of Patent: Jan. 24, 2006

(54) ACCURATE POWER DETECTION FOR A MULTI-STAGE AMPLIFIER

(75) Inventors: Li Liu, Littleton, MA (US); Christopher C. Souchuns, Ashland, MA (US); Ping Li, Dunstable, MA (US); Gregory N. Henderson, Sudbury, MA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/803,850

(22) Filed: Mar. 17, 2004

(65) Prior Publication Data

US 2004/0174214 A1 Sep. 9, 2004

Related U.S. Application Data

(62) Division of application No. 10/459,239, filed on Jun. 10, 2003.
(60) Provisional application No. 60/424,526, filed on Nov. 6, 2002.

(51) Int. Cl.
*H03G 3/20* (2006.01)

(52) U.S. Cl. ........................................ 330/133; 330/140
(58) Field of Classification Search ................ 330/129, 330/133, 134, 136, 140
See application file for complete search history.

(56) References Cited

U.S. PATENT DOCUMENTS

| 3,109,992 | A |   | 11/1963 | Elliot |
|---|---|---|---|---|
| 3,274,505 | A |   | 9/1966 | Frisch et al. |
| 3,374,442 | A |   | 3/1968 | Griffin |
| 3,967,207 | A |   | 6/1976 | Wheatley, Jr. |
| 4,442,407 | A |   | 4/1984 | Apel |
| 4,456,889 | A | * | 6/1984 | Kumar ........................ 330/279 |
| 4,523,155 | A |   | 6/1985 | Walczak et al. |
| 4,578,648 | A |   | 3/1986 | Werrbach |
| 4,636,741 | A |   | 1/1987 | Mitzlaff |
| 4,760,347 | A |   | 7/1988 | Li et al. |
| 4,794,343 | A |   | 12/1988 | Yang |
| 4,994,757 | A |   | 2/1991 | Bickley et al. |
| 5,030,922 | A |   | 7/1991 | Rumreich et al. |
| 5,081,425 | A |   | 1/1992 | Jackson et al. |
| 5,081,713 | A |   | 1/1992 | Miyazaki |
| 5,126,688 | A |   | 6/1992 | Nakanishi et al. |
| 5,129,098 | A |   | 7/1992 | McGirr et al. |
| 5,138,274 | A |   | 8/1992 | Nakanishi et al. |
| 5,144,258 | A |   | 9/1992 | Nakanishi et al. |
| 5,168,148 | A | * | 12/1992 | Giebel .................... 235/462.26 |
| 5,182,527 | A |   | 1/1993 | Nakanishi et al. |
| 5,192,919 | A |   | 3/1993 | Wieczorek |
| 5,196,806 | A |   | 3/1993 | Ichihara |
| 5,204,613 | A |   | 4/1993 | Cripps et al. |

(Continued)

FOREIGN PATENT DOCUMENTS

WO    WO 96/33555    10/1996

*Primary Examiner*—Steven J. Mottola
(74) *Attorney, Agent, or Firm*—Bever, Hoffman & Harms

(57) ABSTRACT

A multi-stage amplifier is coupled with a power detector. The multi-stage amplifier includes a plurality of amplifier stages in series, with a signal path extending through them. The power detector is coupled to an interior node of the amplifier along the signal path, and is operable to sample a first signal being transmitted on the signal path. The power detector outputs a second signal reflective of a power of the first signal. In one embodiment, the interior node is in a matching network of the amplifier disposed between a first amplifier stage and a final amplifier stage of the amplifier. The second signal may be used in a feedback network to adjust an amount of amplification of the first signal by the amplifier.

26 Claims, 6 Drawing Sheets

U.S. PATENT DOCUMENTS

| | | |
|---|---|---|
| 5,251,330 A | 10/1993 | Chiba et al. |
| 5,311,143 A | 5/1994 | Soliday |
| 5,337,006 A | 8/1994 | Miyazaki |
| 5,381,115 A | 1/1995 | Timmons et al. |
| 5,404,586 A | 4/1995 | Ishiguro |
| 5,422,598 A | 6/1995 | Maeda et al. |
| 5,442,317 A | 8/1995 | Stengel |
| 5,446,756 A | 8/1995 | Mallinckrodt |
| 5,532,646 A | 7/1996 | Aihara |
| 5,559,471 A | 9/1996 | Black |
| 5,604,924 A | 2/1997 | Yokoya |
| 5,613,229 A | 3/1997 | Baranowski et al. |
| 5,629,648 A | 5/1997 | Pratt |
| 5,640,691 A | 6/1997 | Davis et al. |
| 5,659,893 A | 8/1997 | Enoki et al. |
| 5,678,209 A | 10/1997 | Strakovsky |
| 5,689,815 A | 11/1997 | Yamazaki et al. |
| 5,710,519 A | 1/1998 | McCalpin et al. |
| 5,732,334 A | 3/1998 | Miyake |
| 5,745,016 A | 4/1998 | Salminen |
| 5,757,226 A | 5/1998 | Yamada et al. |
| 5,757,237 A | 5/1998 | Staudinger et al. |
| 5,774,797 A | 6/1998 | Kawano et al. |
| 5,777,519 A | 7/1998 | Simopoulos |
| 5,808,515 A | 9/1998 | Tsuruoka et al. |
| 5,832,374 A | 11/1998 | Birth et al. |
| 5,834,977 A | 11/1998 | Maehara et al. |
| 5,884,149 A | 3/1999 | Jaakola |
| 5,892,396 A | 4/1999 | Anderson et al. |
| 5,892,397 A | 4/1999 | Belcher et al. |
| 5,892,403 A | 4/1999 | Brandt |
| 5,955,926 A | 9/1999 | Uda et al. |
| 5,986,509 A | 11/1999 | Lohninger |
| 5,990,751 A | 11/1999 | Takita |
| 6,034,519 A | 3/2000 | Yang |
| 6,049,703 A | 4/2000 | Staudinger et al. |
| 6,052,020 A | 4/2000 | Doyle |
| 6,064,269 A | 5/2000 | Ruppel et al. |
| 6,121,842 A | 9/2000 | Adlerstein et al. |
| 6,137,355 A | 10/2000 | Sevic et al. |
| 6,148,220 A | 11/2000 | Sharp et al. |
| 6,150,872 A | 11/2000 | McNeill et al. |
| 6,163,706 A | 12/2000 | Rozenblit et al. |
| 6,201,445 B1 | 3/2001 | Morimoto et al. |
| 6,239,658 B1 | 5/2001 | Tham |
| 6,242,983 B1 | 6/2001 | Shiao |
| 6,246,286 B1 | 6/2001 | Persson |
| 6,265,943 B1 | 7/2001 | Dening et al. |
| 6,359,514 B1 | 3/2002 | King et al. |
| 6,362,605 B1 | 3/2002 | May |
| 6,484,017 B1 | 11/2002 | Kim |
| 6,624,702 B1 | 9/2003 | Dening |
| 2002/0030269 A1 | 3/2002 | Ammar |
| 2002/0094791 A1 | 7/2002 | Pehike et al. |
| 2002/0132652 A1 | 9/2002 | Steel et al. |
| 2002/0137481 A1 | 9/2002 | Chen et al. |
| 2003/0040343 A1 | 2/2003 | Epperson et al. |
| 2003/0042885 A1 | 3/2003 | Zhou et al. |
| 2003/0198300 A1 | 10/2003 | Matero et al. |

\* cited by examiner

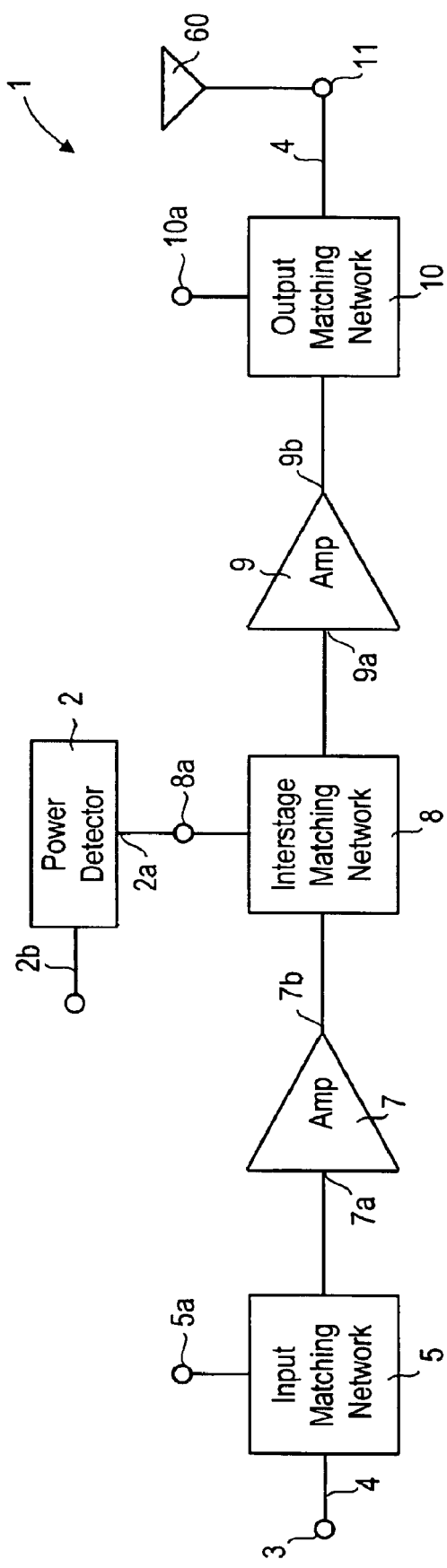
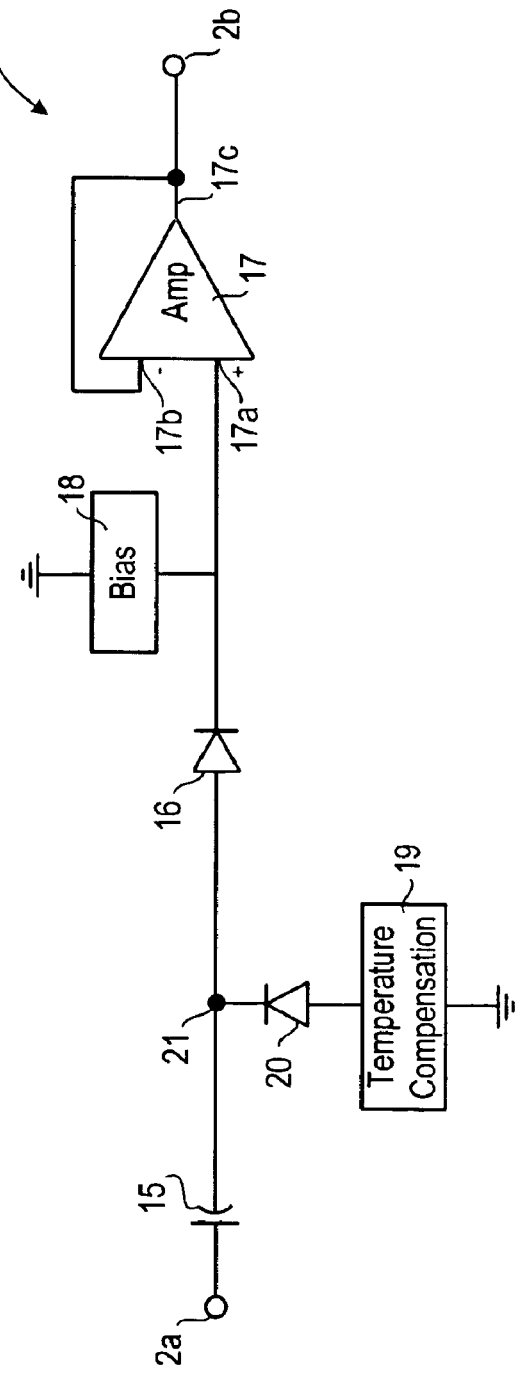
FIG. 1
FIG. 1A

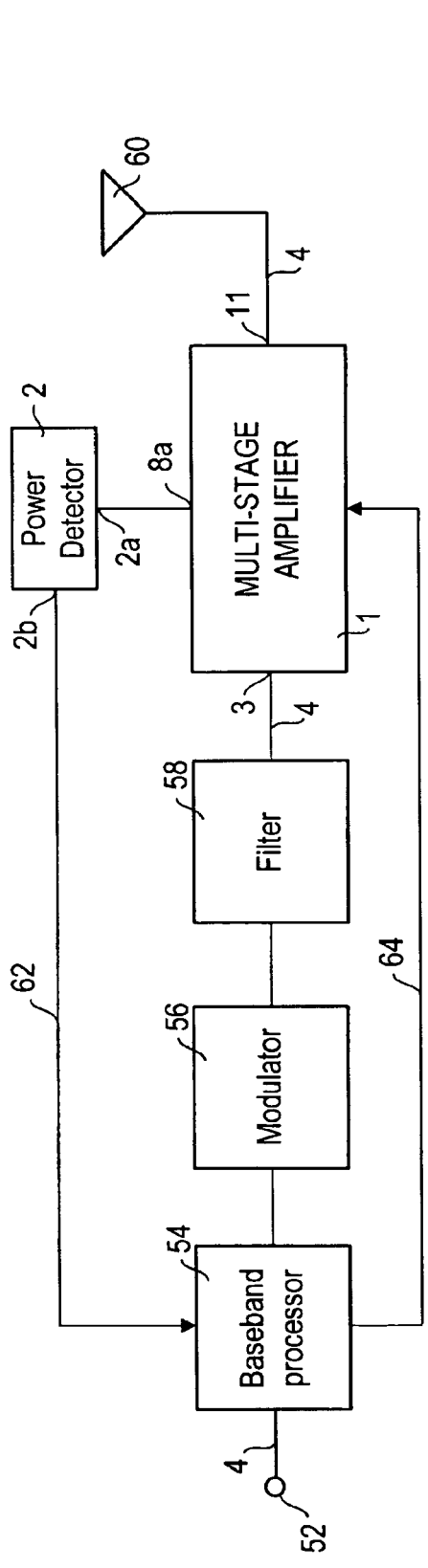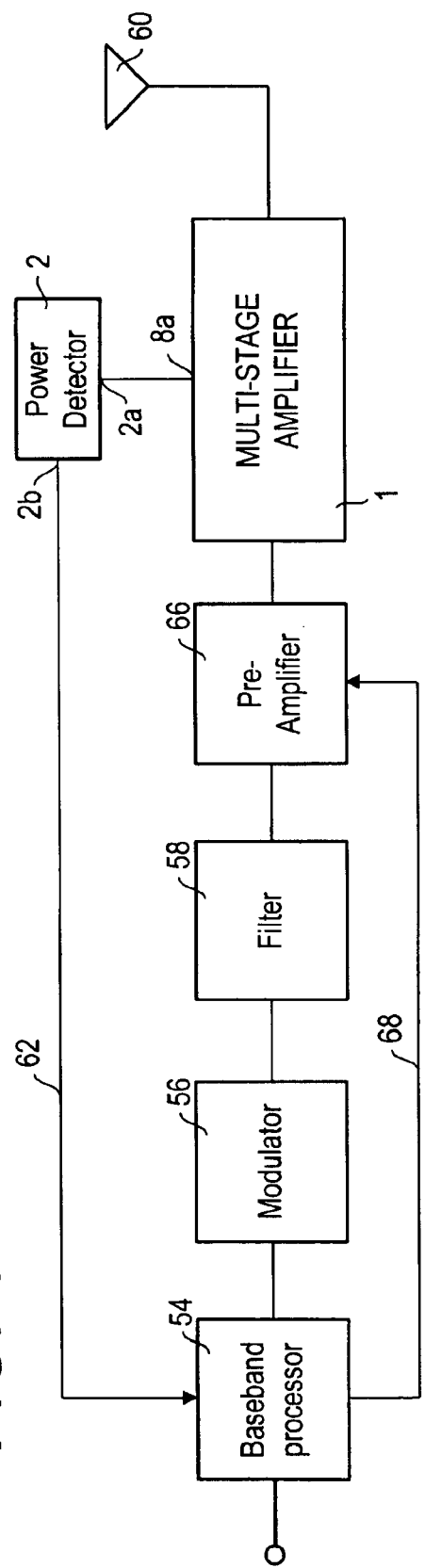

ACCURATE POWER DETECTION FOR A MULTI-STAGE AMPLIFIER

CROSS-REFERENCE TO RELATED APPLICATION

This application is a division of U.S. patent application Ser. No. 10/459,239, filed on Jun. 10, 2003. This application claims priority to U.S. Provisional Patent Application Ser. No. 60/424,526, filed on Nov. 6, 2002, which is incorporated herein by reference in its entirety.

BACKGROUND OF THE INVENTION

1. Technical Field

The present disclosure relates to amplifiers having a plurality of amplifier stages, and in particular to methods and structures for detecting the output power of such amplifiers.

2. Discussion of the Related Art

Power detectors are used in radio frequency (RF) communications systems to monitor the power of an RF signal that is output to an antenna. The power detector produces a direct current (DC) signal that is proportional to the power of the RF signal being sampled. The communications system can then use the DC signal as a measure of the power of the RF signal being transmitted, and can make adjustments in order to maintain the output power within system specifications.

Conventional power detection techniques sample the RF signal immediately before the antenna, after a final amplifier stage of a multi-stage amplifier amplifies the RF signal and after the RF signal passes through a final matching network between the final amplifier stage and the antenna. However, under conditions where the amplifier load is not impedance matched properly, which may be due to a faulty or broken antenna or to environmental conditions, the voltage monitored by the power detector can be in error, in that the voltage no longer accurately predicts the true output power. Depending upon the conditions, the detector could overestimate or underestimate the actual power.

An underdetection of the output power could have serious consequences. For instance, the communications system may work to increase the output power by further amplifying the RF signal, based on the erroneous information that the output power is too low. The communications system might then increase the output power beyond a safe or regulated level. Outputting too much power could lead to a violation of health regulations, a danger to users, lawsuits, and the like. In addition, the efficiency of the communications system would be reduced, since the communications system would be expending more energy than necessary to amplify the outgoing RF signal. Such would be particularly problematic in wireless applications, such as cellular phones, that operate on battery power. The battery power reserve could be needlessly depleted.

Therefore, there exists a need to accurately measure the power of an RF signal amplified by a multi-stage amplifier, and to avoid underdetecting the power of the RF signal.

SUMMARY OF THE DISCLOSURE

Embodiments of the present invention include a method, system and circuit for accurately determining the power of signals amplified by a multi-stage amplifier.

In one embodiment, a multi-stage amplifier is provided in a signal path. The multi-stage amplifier amplifies a signal, which may be an RF signal, that passes through the signal path. A power detector is coupled to the signal path at an interior node of the multi-stage amplifier, and samples the signal at the interior node.

Most broadly, the interior node is between, but exclusive of, the input and output nodes of the multistage amplifier. More particularly, the interior node may be between the output node of a first amplifier stage and the output node of a last amplifier stage of the multi-stage amplifier, excluding the output node of the final amplifier stage. Even more particularly, the interior node is between, and inclusive of, the output node of the first amplifier stage and an input node of the final amplifier stage.

The power detector samples the signal at the selected interior node of the multi-stage amplifier, and outputs a feedback signal that reflects the power of the signal at the interior node. A processor or other control circuit receives the feedback signal from the power detector, and initiates an adjustment so that the amplified signal output by the multi-stage amplifier is at the proper power level.

In an alternative embodiment, a power detector may sample the signal at a plurality of interior nodes, and may output a feedback signal to the processor that reflects a sum of the power as the plurality of interior nodes.

In a further embodiment, a wireless communications device comprises a baseband processor, a multi-stage amplifier, and an antenna, electrically coupled together in series, and defining a signal path for an RF signal. The wireless communications device also comprises a power detector coupled to an interior node in the signal path of the multi-stage amplifier. The power detector samples the RF signal at the interior node, and provides a feedback signal to the baseband processor. Using the feedback signal, the baseband processor can adjust the amplification of the RF signal by the multi-stage amplifier, or can adjust the amplification of the RF signal by a preamplifier in the signal path that provides the RF signal to the multi-stage amplifier.

These and other aspects of the present invention will become more apparent through consideration of the accompanying drawings, and the following detailed description, of the exemplary embodiments.

BRIEF DESCRIPTION OF THE DRAWINGS

FIG. 1 is a block diagram of an embodiment of a multi-stage amplifier coupled with a power detector in accordance with the present invention;

FIG. 1A is a diagram of a conventional power detector that may be used in accordance with the present invention;

FIGS. 4 and 4A are simplified block diagrams of embodiments of a radio frequency transmission circuit in accordance with the present invention.

In the present disclosure, like objects that appear in more than one figure are provided with like reference numerals.

DETAILED DESCRIPTION

Figure 1B:
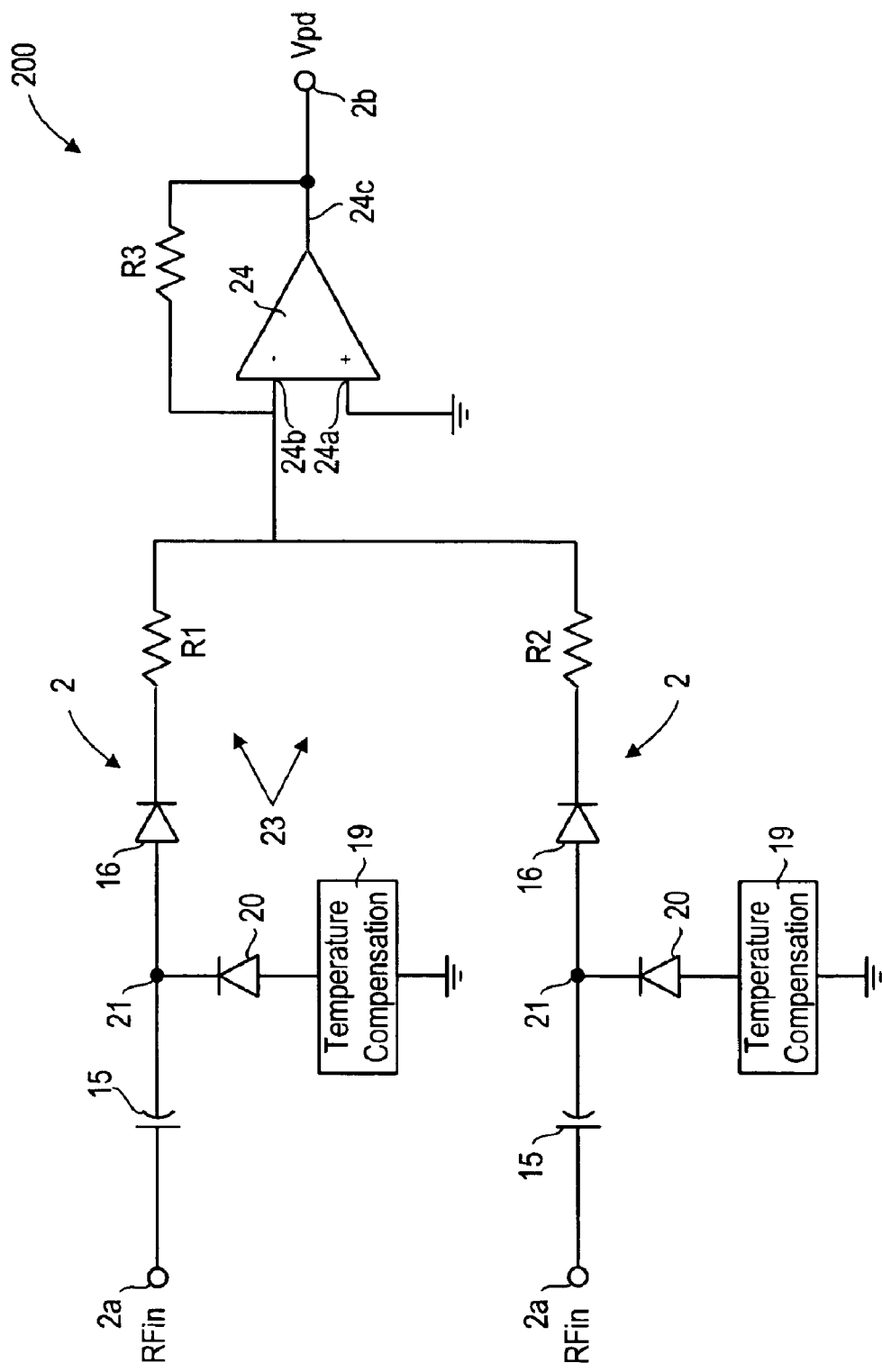
FIGS. 1B and 1C are diagrams of alternative power detectors that may be used in accordance with the present invention.

FIG. 1 is a block diagram of an embodiment of a multi-stage amplifier 1 coupled with a power detector 2. An input node 3 of multi-stage amplifier 1 receives a signal that is to be amplified. Multi-stage amplifier 1 outputs the amplified signal at an output node 11 of multi-stage amplifier 1. A signal path 4 for transmitting the signal extends through multi-stage amplifier 1 between input node 3 and output node 11. In this example, the signal to be amplified by multi-stage amplifier 1 is an RF signal, though signals having other frequencies could be used. Assume for the purpose of example that output node 11 is coupled to a load, and in particular to an antenna that broadcasts the RF signal output by multi-stage amplifier 1.

An input matching network 5 is coupled to input node 3 and provides for proper matching of impedances between input node 3 and a first amplifier stage 7. A node 5a is in the signal path 4 within input matching network 5. First amplifier stage 7 has its input 7a coupled to receive the RF signal from input matching network 5. First amplifier stage 7 provides the amplified RF signal at its output 7b, from which the RF signal passes to the input of an interstage matching network 8. Interstage matching network 8 provides for matching of impedances between first amplifier stage 7 and a second amplifier stage 9. Node 8a is in the signal path 4 within interstage matching network 8. Second amplifier stage 9 receives the RF signal at its input 9a from interstage matching network 8, and outputs a further amplified RF signal at its output 9b. Output 9b of second amplifier stage 9 is coupled to output matching network 10. Output matching network 10 provides for matching of impedances between second amplifier stage 9 and the load, such as antenna 60, that is coupled to output node 11 of multi-stage amplifier 1. A node 10a is in the signal path 4 within output matching network 10.

Input matching network 5, interstage matching network 8, and output matching network 10 may include inductors, capacitors, resistors, and other components common to impedance matching networks.

In the prior art, an input 2a of the power detector 2 would be coupled to output node 11 of multi-stage amplifier 1 in order to determine the output power of the signal being amplified by multi-stage amplifier 1 and provided to antenna 60.

We have found, however, that coupling power detector 2 to output node 11 provides a significant risk of underdetection of the power of the signal provided at output node 11. Therefore, in accordance with our invention, we couple power detector 2 not to output node 11, but rather to an interior node, or a plurality of interior nodes, within multi-stage amplifier 1 on the signal path 4. The characteristics of the amplifier downstream of the point of sampling is known to the user of output of power detector 2

Most broadly, the interior node is between, but exclusive of, input node 3 and output node 11 of multi-stage amplifier 1. This would include, for instance, connecting the power detector 2 to nodes 5a, 7a, 7b, 8a, 9a, 9b, or 10a on signal path 4, but would not include connecting power detector 2 to input node 3 or output node 11. In FIG. 1, input 2a of power detector 2 is shown coupled to the signal path 4 at node 8a. Node 8a is within interstage matching network 8, downstream of the output 7b of first amplifier stage 7. Detection at nodes 5a or 7a alone would require that the user of the detected power signal, e.g., a baseband processor as in FIG. 4, has accurate knowledge of the downstream characteristics of the amplifier. A signal reflective of the detected power at the interior node is provided by power detector 2 at its output 2b.

In a particular embodiment, input 2a of the power detector 2 is coupled to an interior node of multi-stage amplifier 1 that is between input node 7a of the first amplifier stage 7 and output node 11, exclusive of input node 7a and output node 11. This embodiment would include, for instance, coupling power detector 2 to nodes 7b, 8a, 9a, 9b, and 10a on signal path 4, but would exclude coupling power detector 2 to node 5a, input node 7a or output node 11.

In a further embodiment, input 2a of the power detector 2 is coupled to an interior node of multi-stage amplifier 1 that is between output node 7b of the first amplifier stage 7 and output node 11, exclusive of output node 11. This embodiment would include, for instance, coupling power detector 2 to nodes 7b, 8a, 9a, 9b, and 10a along signal path 4, but would exclude coupling power detector 2 to input node 5a, input node 7a, any nodes of first amplifier stage 7 prior to output node 7b, and output node 11.

In a further embodiment, input 2a of the power detector 2 is coupled to an interior node of multi-stage amplifier 1 in signal path 4 that is between, and inclusive of, the output node 7b of the first amplifier stage 7 and the output node 9b of the second amplifier stage 9, but excludes nodes upstream or downstream of nodes 7b and 9b, respectively. This embodiment would include, for instance, coupling power detector 2 to nodes 7b, 8a, 9a, or 9b along signal path 4, but would exclude coupling power detector 2 to nodes 3, 5a, 9b, and 10a.

In a further embodiment, input 2a of the power detector 2 is coupled to an interior node of multi-stage amplifier 1 in signal path 4 that is between the output node 7b of the first amplifier stage 7 and the output node 9b of the second amplifier stage 9, excluding output node 9b. This embodiment would include, for instance, coupling power detector 2 to nodes 7b, 8a, or 9a along signal path 4, but would exclude coupling power detector 2 to nodes 3, 5a, 7a, 9b, and 10a.

In a further embodiment, input 2a of the power detector 2 is coupled to an interior node of multi-stage amplifier 1 in signal path 4 that is between, but exclusive of, the output node 7b of the first amplifier stage 7 and the output node 9b of the second amplifier stage 9. This embodiment would include, for instance, coupling power detector 2 to nodes 8a or 9a in signal path 4, but would exclude coupling power detector 2 to nodes 3, 5a, 7a, 7b, 9b, and 10a.

As a final exemplary embodiment, input 2a of the power detector 2 is coupled to an interior node of multi-stage amplifier 1 along signal path 4 that is between output node 7b of the first amplifier stage 7 and the input node 9a of the second amplifier stage 9. This embodiment would include, for instance, coupling power detector 2 to nodes 7b, 8a, or 9a along signal path 4, but would exclude coupling power detector 2 to nodes 3, 5a, 7a, 9b, and 10a.

In selecting an interior node at which to sample, one may wish to select a node where there is a large voltage variation with power, but that is relatively insensitive to mismatch.

Power detector 2 of FIG. 1 provides a feedback signal, e.g., a DC signal, at its output 2b that reflects the power of the signal on the signal path 4 at the particular interior node being sampled by power detector 2. The feedback signal can be used to change the magnitude of amplification by first amplifier stage 7 and/or second amplifier stage 9 of multi-stage amplifier 1, among other possible uses.

Our coupling of power detector 2 to an interior node of multi-stage amplifier 1 on the signal path 4 that is upstream of output node 11, as opposed to the prior art approach that couples the power detector 2 to output node 11, can provide a more accurate determination of the power of the amplified signal output by multi-stage amplifier 1. Specifically, impedance changes at output node 11 due to changes in the load impedance, e.g., when the antenna is brought into contact with an object, will have a lesser effect on power detector 2 when power detector 2 is coupled in accordance with our invention than when the power detector 2 is coupled to output node 11. Simulation data supporting these and other conclusions is provided below with respect to FIGS. 2, 3A, 3B, and 3C.

Practitioners will appreciate that multi-stage amplifier 1 of FIG. 1 is illustrated at a high level, and that it would apply to numerous specific amplifier implementations.

Figure 2:
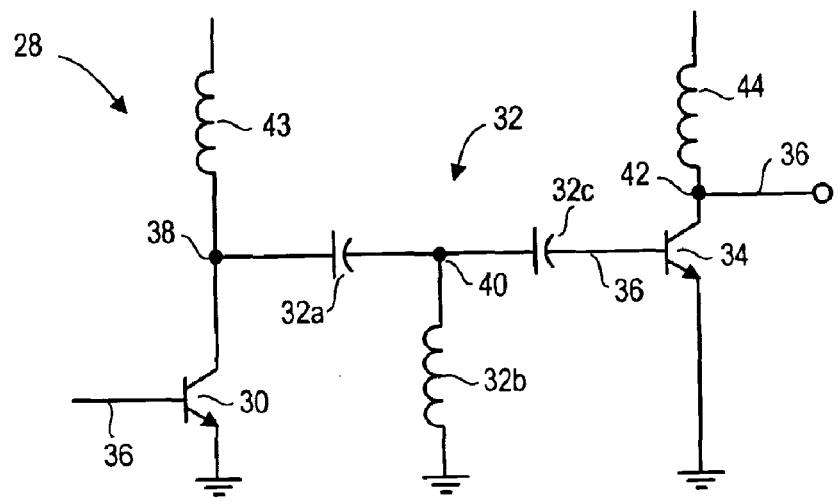
FIG. 2 is a schematic diagram of a simulated two-stage amplifier.

FIG. 2 shows a simulated two-stage, 800 MHz, +28 dBm power amplifier 28. The amplifier 28 includes a first bipolar transistor 30, an interstage matching network 32, and a second bipolar transistor 34 through which a signal path 36 extends. First and second bipolar transistors 30, 34 amplify a signal (here an RF signal) that is input onto the signal path 36 at the gate of first bipolar transistor 30.

Amplifier 28 includes three nodes where a voltage sample is taken by a power detector. The three nodes are: (1) a first stage node 38 at the collector (i.e., output) of first bipolar transistor 30; (2) an interstage node 40 within matching network 32; and (3) a second stage node 42 at the collector (i.e., output) of second bipolar transistor 34.

Interstage matching network 32 in this simulated circuit consists of a first series capacitor 32a coupled between the collector of first transistor 30 (node 38) and interstage node 40; a shunt inductor 32b coupled between interstage node 40 and ground; and a second series capacitor 32c coupled between interstage node 40 and the base of second bipolar transistor 34. Inductors 43 and 44 are coupled to nodes 38 and 42, respectively, as input and output matching networks.

Figure 3A:
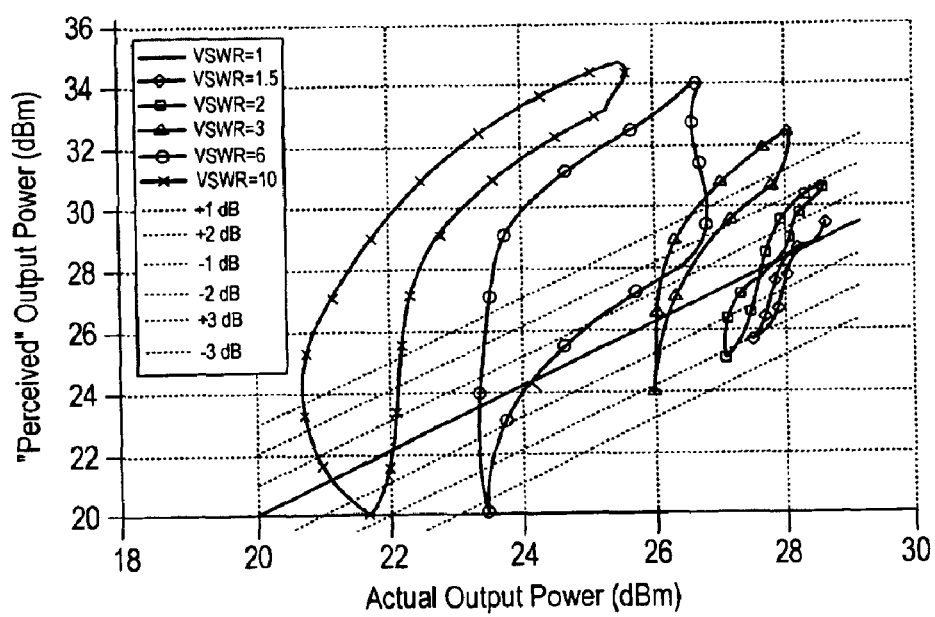
FIGS. 3A, 3B, and 3C are graphs of power detected versus actual power at selected nodes of the simulated two-stage amplifier of FIG. 2.
Figure 3B:
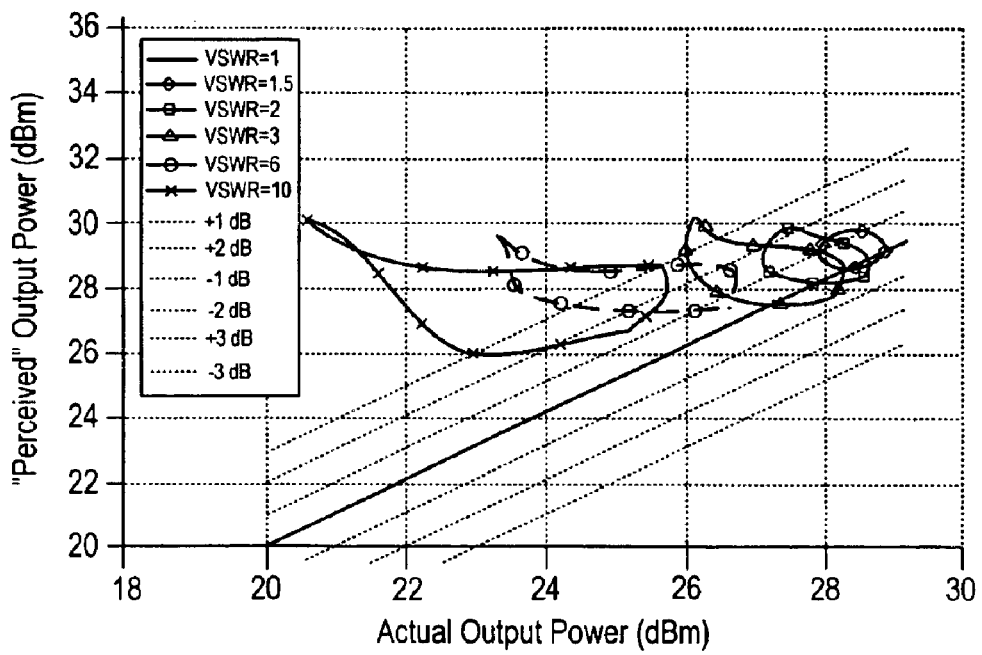
Figure 3C:
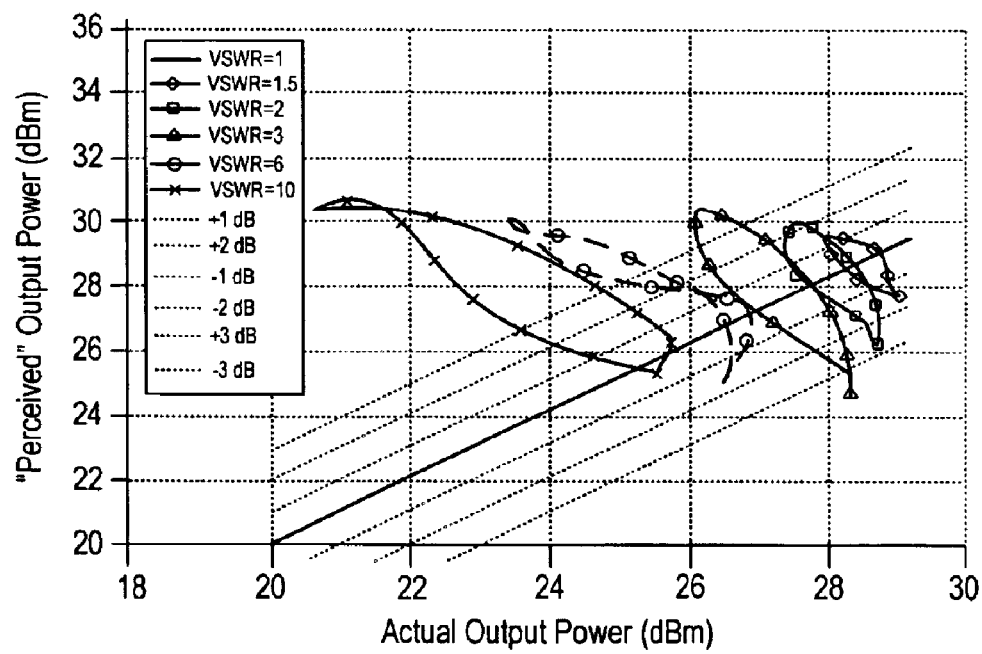

For the simulated circuit of FIG. 2, the range of error where the detected power is lower than the actual output power is between 4 dB and 0.8 dB depending on which of nodes 38, 40, or 42 is sampled, as shown in FIGS. 3A, 3B, and 3C, respectively.

FIGS. 3A, 3B, and 3C illustrate the variance of the voltage at nodes 38, 40, and 42, respectively, of FIG. 2 as a function of the actual output power of amplifier 28 for impedance mismatches at Voltage Standing Wave Ratios (VSWR) of 1:1, 1.5:1, 2:1, 3:1, 6:1, and 10:1.

With respect to FIG. 3A, it can be seen that, when a power detector is coupled to node 38, the maximum underdetection error is 3.0 dB or a 100% under detection. With respect to FIG. 3B, it can be seen that when a power detector is coupled to node 40, the maximum underdetection error is 0.7 dB or a 17% under detection. With respect to FIG. 3C, it can be seen that when a power detector is coupled to node 42, the maximum underdetection error is 3.6 dB or a 130% under detection.

Thus, from the data of FIG. 3C, one can see that, for the simulated multi-stage amplifier 28 of FIG. 2, the least favorable place, in terms of the amount of possible underdetection error, to couple a power detector to the signal path 36 is at the output of the final amplifier stage 34, i.e., at node 42. From the data of FIG. 3A, one can see that, for the simulated amplifier 28 of FIG. 2, a better place to couple a power detector to the signal path 36, in terms of the amount of possible underdetection error, is at node 38 at the output of the first amplifier stage 30. Finally, from the data of FIG. 3B, a still better place to couple a power detector to the signal path 36, in terms of the amount of possible underdetection error, is at node 40 within interstage network 30, which is between the output of the first amplifier stage 30 and the input of the second amplifier stage 34.

With respect to the multi-stage amplifier 1 of FIG. 1, the data of FIGS. 2, 3A, 3B, and 3C counsels against the coupling of power detector 2 to the signal path 4 at the output node 11 of multi-stage amplifier 1, due to the relatively great amount of underdetection possible in an impedance mismatch condition. As mentioned above, it would be better to couple power detector 2 to an interior node of amplifier 1 that is inward of, and exclusive of, input node 3 and output node 11. Coupling the power detector 2 to node 8a is expected to yield the lowest amount of underdetection error.

In the embodiment of FIG. 1, a multi-stage amplifier 1 with two stages is depicted. In a case where multi-stage amplifier 1 has more than two stages, a power detector 10 can be coupled to any interior node in the signal path through the multi-stage amplifier. For instance, in a multi-stage amplifier with three stages, the power detector 2 could be coupled to the signal path between the first and second amplifiers, or between the second and third amplifier stages.

The configuration of power detector 2 and its means of coupling to signal path 4 at the selected interior node of multi-stage amplifier 1 of FIG. 1 can vary.

For instance, in FIG. 1A, a block diagram of a conventional Schottky diode power detector is depicted as an example of power detector 2. As mentioned above, an input 2a of power detector 2 is coupled to an interior node of multi-stage amplifier 1, e.g., node 8a, of FIG. 1. A capacitor 15 is provided at input 2a in order to provide AC coupling. Capacitor 15 also is coupled to an input of a diode 16. Diode 16 that provides half-wave rectification. The output of diode 16 is coupled to a non-inverting input 17a of an operational amplifier 17. The inverting input 17b of operational amplifier 17 is coupled to its output 17c. The output of operational amplifier 17 is provided to the output 2b of power detector 2. Temperature compensation circuit 19 provides additional or reduced bias to the input signal in order to compensate for temperature. Temperature compensation 19 circuit can be a known temperature compensation circuit. Bias circuit 18 may be coupled to the inverting input 17b of operational amplifier 17.

In an alternative embodiment, a power detector is coupled to a plurality of interior nodes of multi-stage amplifier 1, and a signal reflective of the power at those plural interior nodes is generated. Sampling a plurality of interior nodes of multi-stage amplifier, and summing the detected voltages can potentially provide more accurate power detection. The number of interior nodes sampled can vary.

Figure 1C:
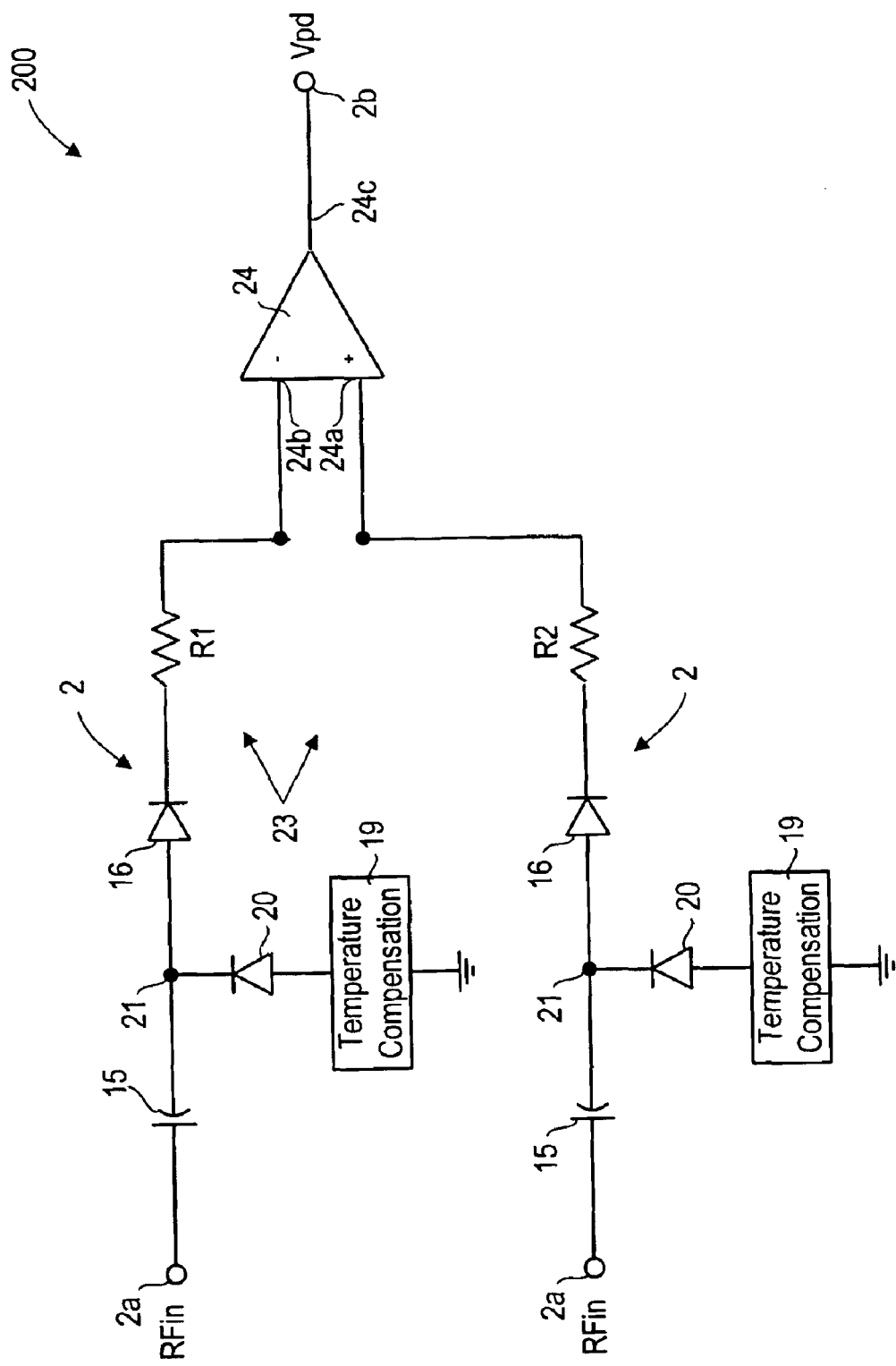

For instance, in FIG. 1B, a multiple node power detector 200 is shown. Power detector 200 includes a plurality of power detectors 2, one for each of the interior nodes of the multi-stage amplifier 1 that are being sampled. In this example, power detector 200 includes two power detectors 2. Each power detector 2 includes an input 2a, a coupling capacitor 15, a half-wave rectifying diode 16, and a temperature compensation circuit 19, as described above for FIG. 1A. The respective inputs 2a are each coupled to a different one of the plural interior nodes being sampled, e.g., one to node 8a and one to amplifier output 9b. A summing amplifier 23 is coupled to the output of each of the diodes 16. Summing amplifier 23 includes resistors R1, R2, and R3, and an operational amplifier 24. Each of resistors R1 and R2 is coupled between the output of the diode 16 and the inverting input 24b of operational amplifier 24. The non-inverting input 24a of operational amplifier 24 is coupled to ground. Resistor R3 is coupled between the output 24c of operational amplifier 24 and the inverting input 24b of operational amplifier 24. Summing amplifier 23 sums the respective signal outputs of the respective power detectors 2, and outputs a sum signal (e.g., a DC voltage) that reflects the power at the plural interior nodes being sampled. The ratio of the values of resistors R1 and R2 determines the weight that will be accorded to the respective interior nodes in the output of summing amplifier 23. For instance, if R1=R2, then equal weight is accorded to the two interior nodes being sampled by multiple node power detector 200. On the other hand, if R1<R2, then greater weight would be given to the sample passed through the power detector 2 that includes R2. Such unequal weighting may be desirable where one interior node provides relatively more useful data.

While a particular summing amplifier 23 is provided in the exemplary circuit of FIG. 1B, any other known circuits capable of summing the outputs of the plural power detectors 2 may be used. In addition, instead of using a summing circuit, other circuits may be coupled to the output of the diodes 16, to create a different type of signal reflective of the detected power at the plural interior nodes. For instance, referring to FIG. 1C, a differential signal may be produced. That is, in place of summing amplifier 23, a differential amplifier 23 may be used that determines a difference between the signal outputs of the respective power detectors 2, and outputs a differential signal that reflects the output power.

Referring to FIG. 4, a simplified block diagram of an embodiment of a radio frequency transmission circuit 50 of a wireless communications device, e.g., a cellular phone, is illustrated. Radio frequency transmission circuit 50 may be implemented on a single integrated circuit, or may be implemented in an integrated circuit that is coupled to external, discrete components.

In radio transmission circuit 50, a baseband processor 54 receives data, which may be voice data and/or packet data, at an input node 52 on signal path 4. Baseband processor 54 may further process the data, and then outputs the data onto the signal path 4. Based on a specified modulation standard, a modulator 56 modulates the data to produce an RF modulated signal. A filter 58 provides a filtered output of the modulated signal to input node 3 of multi-stage amplifier 1 (see FIG. 1). Multi-stage amplifier 1 amplifies the modulated signal to generate an amplified RF signal, which is sent via output node 11 to antenna 60 for broadcasting.

In accordance with the present invention, power detector 2 of FIG. 1A is coupled to multi-stage amplifier 1 at a node in the signal path 4 upstream of output node 11. In this particular embodiment, power detector 2 is coupled to the signal path 4 at node 8a, as was shown in FIG. 1. Note that multi-stage amplifier 1 may have more than two amplifier stages, and that power detector 2 could be coupled the signal path 4 at an interior node between any of the amplifier stages.

Power detector 2 outputs a feedback signal (e.g., a DC voltage) at its output 2b that is provided to baseband processor 54 on line 62. The feedback signal is indicative of the power of the RF signal sampled at node 8a of the signal path 4 (i.e., after the output of first amplifier stage 7 and before the input of second amplifier stage 9). Based on the magnitude of the feedback signal provided by power detector 2, baseband processor 54 then can adjust the magnitude of amplification by amplifier 1 by providing a control signal to multi-stage amplifier 1 on line 64. For instance, the magnitude of amplification provided to the RF signal by multi-stage amplifier 1 can be adjusted by changing a reference voltage that is being provided to a DC bias circuit (not shown) for multi-stage amplifier 1. Baseband processor 54 accounts for characteristics of multi-stage amplifier 1 downstream of the sampled interior node using, for instance, stored values in memory, software, and/or firmware.

In an alternative embodiment shown in FIG. 4A, a preamplifier 66 is provided in signal path 4 between filter 58 and multi-stage amplifier 1. Baseband processor 54 is coupled to the preamplifier 66 by line 68. Baseband processor 54 can provide a control signal on line 68 to preamplifier 66 to adjust an amount of amplification of the RF signal on signal path 4 upstream of multi-stage amplifier 1. For instance, the control signal can adjust a DC bias current provided to the preamplifier 66 to change its amount of amplification of the RF signal. Accordingly, the RF signal provided on signal path 4 to input node 3 of multi-stage amplifier 1 will have a magnitude that will allow multi-stage amplifier 1 to amplify the RF signal to the desired power level. In determining the control signal provided to preamplifier 66, baseband processor 54 must account for the expected amount of amplification to be provided to the RF signal by multi-stage amplifier 1.

In a further alternative embodiment that combines aspects of FIGS. 4 and 4A, baseband processor 54 may be coupled both to preamplifier 66 and to multi-stage amplifier 1, and may selectively control either or both of preamplifier 66 and multi-stage amplifier 1 based on the feedback signal provided by power detector 2.

In an alternative embodiment, power detector 200 of FIG. 1B may be coupled to multi-stage amplifier 1 of FIGS. 4 and 4A, so that the power of the RF signal at a plurality of interior nodes on signal path 4 within multi-stage amplifier 1 may be detected. As mentioned, power detector 200 outputs a voltage that is a sum of the respective voltage samples taken at each of the plural interior nodes being sampled. The output of power detector 200 at its output 2b may then be fed to baseband processor 54 over line 62 for the purpose of adjusting multi-stage amplifier 1 and/or preamplifier 60.

Radio frequency transmission circuit 50 may operate according to any number of communication standards, including, but not limited to, the CDMA, WCDMA, Global System for Mobile Communications (OSM), and the Advanced Mobile Phone Service (AMPS) standards. Further, radio frequency transmission circuit 50 can be included in a device that both receives and transmits radio frequency signals, such as a battery-powered cellular phone.

The circuits and methods of the present application may be incorporated together in a single integrated circuit, or provided on plural coupled integrated circuits, made with silicon, silicon germanium, gallium arsenide, or other process technologies. Also, the components described herein can be a combination of integrated circuit(s) and discrete components.

Other circuits and systems in related technological areas are depicted and described in U.S. Provisional Patent Application No. 60/418,816, filed Oct. 15, 2002, entitled "A Continuous Bias Power Amplifier," and 60/419,027, filed Oct. 15, 2002, entitled "An Automatically Biased Power Amplifier," both of which are incorporated herein by reference in their respective entireties.

The detailed description provided above is merely illustrative, and is not intended to be limiting. While embodiments, applications and features of the present inventions have been depicted and described, there are many more embodiments, applications and features possible without deviating from the spirit of the inventive concepts described and depicted herein.

What is claimed is:

1. An amplifier circuit comprising:
   an amplifier comprising an input, an output, and a plurality of amplifier stages coupled in series between the input and the output, wherein a signal path extends through the plurality of amplifier stages between the input and the output; and
   a power detector circuit including a first input and a second input, each coupled to sample a signal transmitted along the signal path, wherein the first input is coupled to a first interior node of the signal path and the second input is coupled to a second interior node of the signal path, the first and second interior nodes being disposed between, but exclusive of, the input and the output of the amplifier, wherein the power detector circuit is operable to sample the signal transmitted along the signal path at both the first and second interior nodes, thereby creating first and second sample signals, respectively, and combine the first and second sample signals to generate a first signal reflective of both the first and second sample signals.

2. The amplifier circuit of claim 1, wherein the plurality of amplifier stages comprises:
   a first amplifier stage having an input connected to the input of the amplifier;
   a final amplifier stage having an output connected to the output of the amplifier; and
   at least one intermediate amplifier stage coupled between the first amplifier stage and the final amplifier stage in the signal path,
   wherein the first input is coupled for sampling between either the first amplifier stage and the at least one intermediate amplifier stage or between the at least one intermediate amplifier stage and the final amplifier stage.

3. The amplifier circuit of claim 2, wherein the amplifier comprises an output matching network having an input coupled to the output of the final amplifier stage and an output that forms the output of the amplifier.

4. The amplifier circuit of claim 1, wherein the amplifier includes a matching network in the signal path within the amplifier and coupled between respective ones of the plurality of amplifier stages, wherein the first interior node is within the matching network.

5. The amplifier circuit of claim 1, further comprising a bias circuit, wherein the bias circuit provides a DC bias signal to at least one of the plurality of amplifier stages, the bias signal depending, at least in part, on the first signal.

6. The amplifier circuit of claim 5, wherein the amplifier includes a matching network in the signal path within the amplifier and coupled between respective ones of the plurality of amplifier stages, wherein the first interior node is within the matching network.

7. The amplifier circuit of claim 1, wherein the plurality of amplifier stages comprises a first amplifier stage having an input connected to the input of the amplifier, the amplifier circuit further comprising a bias circuit, wherein the bias circuit provides a variable bias signal to the first amplifier stage, the bias signal depending, at least in part, on the first signal.

8. The amplifier circuit of claim 1, wherein the first signal reflects a summing of signals derived from the sampling at the at least first and second inputs.

9. The amplifier circuit of claim 1, wherein the first signal reflects a difference between signals derived from the sampling at the at least first and second inputs.

10. The amplifier circuit of claim 1, wherein the first signal reflects a greater weight given to a signal derived from the sampling at one of the first and second inputs than to a signal derived from the sampling at other of the first and second inputs.

11. An amplifier circuit comprising:
    an amplifier comprising an input, an output, and a plurality of amplifier stages coupled in series between the input and the output, wherein a signal path extends through the plurality of amplifier stages between the input and the output; and
    a power detector circuit including at least first and second inputs each coupled to sample a signal, wherein the first and second inputs are each coupled to the signal path at first and second interior nodes, respectively, of the amplifier, the first and second interior nodes being disposed between, but exclusive of, the input and the output of the amplifier, and the power detector circuit is operable to output a first signal reflective of the signal sampled at the at least first and second inputs.

12. The amplifier circuit of claim 11, wherein the amplifier includes a matching network in the signal path within the amplifier and coupled between respective ones of the plurality of amplifier stages, wherein the first interior node is within the matching network.

13. The amplifier circuit of claim 11, wherein the plurality of amplifier stages comprises a first amplifier stage having an input coupled to the input of the amplifier, and a second amplifier stage having an input coupled to an output of the first amplifier stage, the amplifier circuit further comprising a bias circuit, wherein the bias circuit provides a DC bias signal to at least one of the first and second amplifier stages, the bias signal depending, at least in part, on the first signal.

14. The amplifier circuit of claim 13, wherein the amplifier includes a matching network in the signal path within the amplifier and coupled between respective ones of the plurality of amplifier stages, wherein the first interior node is within the matching network.

15. The amplifier circuit of claim 11, wherein the plurality of amplifier stages comprises a first amplifier stage having an input connected to the input of the amplifier, the amplifier circuit further comprising a bias circuit, wherein the bias circuit provides a variable bias signal to the first amplifier stage, the bias signal depending, at least in part, on the first signal.

16. The amplifier circuit of claim 11, wherein the plurality of amplifier stages comprises a first amplifier stage having an input coupled to the input of the amplifier, and a second amplifier stage having an input coupled to an output of the first amplifier stage, the amplifier circuit further comprising a bias circuit, wherein the bias circuit provides a variable bias signal to the second amplifier stage, the bias signal depending, at least in part, on the first signal.

17. The amplifier circuit of claim 11, wherein the first signal reflects a summing of signals derived from the sampling at the at least first and second inputs.

18. The amplifier circuit of claim 11, wherein the first signal reflects a difference between signals derived from the sampling at the at least first and second inputs.

19. The amplifier circuit of claim 11, wherein the first signal reflects a greater weight given to a signal derived from the sampling at one of the first and second inputs than to a signal derived from the sampling at the other of the first and second inputs.

20. A method comprising:
    providing an amplifier comprising an input, an output, and a plurality of amplifier stages coupled in series between the input and the output, wherein a signal path extends through the plurality of amplifier stages between the input and the output;

sampling a plurality of nodes, including sampling at an interior node within the amplifier that is between, but exclusive of, the input and output of the amplifier;

forming a first signal reflective of the sampling at the plurality of nodes, including the interior node;

providing a DC bias to at least one of the plurality amplifier stages, the DC bias being based, at least in part, on the first signal, wherein the sampling includes sampling at a second interior node on the signal path, the second interior node being between, but exclusive of, the input and output of the amplifier.

21. The method of claim 20, wherein the first signal is formed by summing signals derived from the sampling.

22. The method of claim 20, wherein the first signal is formed based on a difference between signals derived from the sampling.

23. A method comprising:

providing an amplifier comprising an input, an output, and a plurality of amplifier stages coupled in series between the input and the output, wherein a signal path extends through the plurality of amplifier stages between the input and the output;

sampling a plurality of nodes, including sampling at an interior said node within the amplifier that is between, but exclusive of, the input and output of the amplifier;

forming a first signal reflective of the sampling at the plurality of nodes, including the interior said node;

providing a DC bias to at least one of the plurality amplifier stages, the DC bias being based, at least in part, on the first signal, wherein the first signal is formed by summing signals derived from the sampling.

24. A method comprising:

providing an amplifier comprising an input, an output, and a plurality of amplifier stages coupled in series between the input and the output, wherein a signal path extends through the plurality of amplifier stages between the input and the output;

sampling a plurality of nodes, including sampling at an interior said node within the amplifier that is between, but exclusive of, the input and output of the amplifier;

forming a first signal reflective of the sampling at the plurality of nodes, including the interior said node;

providing a DC bias to at least one of the plurality amplifier stages, the DC bias being based, at least in part, on the first signal, wherein the first signal is formed based on a difference between signals derived from the sampling.

25. The amplifier circuit of claim 11, wherein the plurality of amplifier stages comprises:

a first amplifier stage having an input connected to the input of the amplifier;

a final amplifier stage having an output connected to the output of the amplifier; and at least one intermediate amplifier stage coupled between the first amplifier stage and the final amplifier stage in the signal path, wherein the first input is coupled for sampling between either the first amplifier stage and the at least one intermediate amplifier stage or between the at least one intermediate amplifier stage and the final amplifier stage.

26. The amplifier circuit of claim 25, wherein the amplifier comprises an output matching network having an input coupled to the output of the final amplifier stage and an output that forms the output of the amplifier.

* * * * *